United States Patent
Ko et al.

(10) Patent No.: US 8,359,560 B2
(45) Date of Patent: Jan. 22, 2013

(54) METHODS AND SYSTEMS FOR DEBUGGING EQUIVALENT DESIGNS DESCRIBED AT DIFFERENT DESIGN LEVELS

(75) Inventors: Lu-An Ko, Zhongli (TW); Xi Chen, Fremont, CA (US); Arnold Sher, Modiin, IL (US); Furshing Tsai, San Jose, CA (US)

(73) Assignees: Springsoft Inc., Hsinchu (TW); Springsoft USA, Inc., San Jose, CA (US)

( * ) Notice: Subject to any disclaimer, the term of this patent is extended or adjusted under 35 U.S.C. 154(b) by 43 days.

(21) Appl. No.: 13/084,061

(22) Filed: Apr. 11, 2011

(65) Prior Publication Data

US 2012/0084744 A1   Apr. 5, 2012

Related U.S. Application Data

(60) Provisional application No. 61/390,047, filed on Oct. 5, 2010.

(51) Int. Cl.
   *G06F 9/455* (2006.01)
(52) U.S. Cl. ......... 716/106; 716/104; 716/111; 716/136
(58) Field of Classification Search .................... 716/104
   See application file for complete search history.

(56) References Cited

U.S. PATENT DOCUMENTS

| | | | |
|---|---|---|---|
| 6,470,482 B1 * | 10/2002 | Rostoker et al. | 716/102 |
| 2004/0194046 A1 * | 9/2004 | Singhal et al. | 716/11 |
| 2008/0120085 A1 * | 5/2008 | Alexanian et al. | 703/14 |
| 2009/0007034 A1 * | 1/2009 | Granovsky et al. | 716/5 |

OTHER PUBLICATIONS

Cheung, Eric et al., "Bridging RTL and Gate: Correlating Different Levels of Abstraction for Design Debugging", Nov. 7-9, 2007, High Level Design Validation and Test Workshop, 2007. HLVDT 2007, IEEE International, pp. 73-80.*

* cited by examiner

*Primary Examiner* — Paul Dinh
*Assistant Examiner* — Byrce Aisaka
(74) *Attorney, Agent, or Firm* — McClure, Qualey & Rodack, LLP (57) ABSTRACT

Methods for debugging designs are provided. First, signal correlation information for signals of a design at least two design level is obtained. Then, design descriptions corresponding to the design at the at least two design levels are loaded and presented in at least two sets of windows or at least two debugging processes which controls the respective set of windows. A selection of a first signal in a first set of windows or a first debugging process is received. In response to the selection, a second signal corresponding to the first signal is queried according to the signal correlation information, and the second signal in a second set of windows or a second debugging process is automatically selected.

13 Claims, 7 Drawing Sheets

METHODS AND SYSTEMS FOR DEBUGGING EQUIVALENT DESIGNS DESCRIBED AT DIFFERENT DESIGN LEVELS

CROSS REFERENCE TO RELATED APPLICATIONS

This application claims the benefit of U.S. Provisional Application No. 61/390,047 filed Oct. 5, 2010, the entirety of which is incorporated by reference herein.

BACKGROUND OF THE INVENTION

1. Field of the Invention

The disclosure relates generally to methods and systems for debugging designs, and, more particularly to methods and systems for synchronously debugging designs of integrated circuits (ICs) described equivalently at different design levels, such as a register transfer level (RTL) and a gate level.

2. Description of the Related Art

Currently, IC designers mainly work at the RTL when designing complex digital systems, and then synthesize their designs into gate-level implementations with synthesizing tools. Although automated tools for translating designs at different design levels are provided, designers still need to spend a significant amount of time in gate-level implementations since some design issues can only be discovered and resolved at the gate level. For example, these design issues may include manual design changes, timing optimizations, post-synthesis debugging, and others. Due to these design issues, debugging and tracing signals between two different design levels have become a technological bottleneck in the chip design industry.

What is needed is an automatic debugging scheme for synchronously debugging a design described equivalently at different design levels, such as the RTL level and the gate level, so that designers can browse and trace the two design levels at the same time, thus significantly reducing the debugging time for complex designs.

BRIEF SUMMARY OF THE INVENTION

Methods and systems for debugging designs are provided.

In an embodiment of a method for debugging designs, signal correlation information for signals of a design at least two design levels is provided. Then, design descriptions corresponding to the design at the at least two design levels are loaded and presented to the user in at least two sets of windows. A selection of a first signal in a first set of windows is received. In response to the selection, a second signal corresponding to the first signal is queried according to the signal correlation information, and the second signal in a second set of windows is automatically selected. An embodiment of current method may execute at least two separate processes and each process loads a design description at a separate design level and manages a set of the windows for user to debug at that design level. Yet another embodiment of current method may execute only one process with at least two threads wherein each thread loads a design description at a separate design level and manages a set of the windows for user to debug at that design level. Still another embodiment of current method may execute only one process that loads the at least two design descriptions and maintains the at least two sets of the windows for debugging the at least two design descriptions respectively without using multiple threads to mange the at least two design descriptions. It is considered a matter of implementation preference regarding the number of processes and the number of threads in an embodiment of current method, and is immaterial with regard to the spirit of current invention. Obviously, when the multi-process approach is used, a communication link is needed which provides the message sending and receiving between the at least two processes. In order not to clutter the description of the current invention, multi-process approach is used for the remaining part of this disclosure except for those places where such simplification may result in ambiguity. In which case, an explicit description of which implementation approach is taken is provided.

In an embodiment of a method for debugging designs, signal correlation information for signals of a design at least at a first design level and a second design level is provided. Then, a first debugging process is executed to load the design at a first level, say, the RTL level, and a second debugging process is executed to load the design at a second level, say, the gate level. When a selection of a first signal in the first debugging process is received, a second signal corresponding to the first signal is queried according to the signal correlation information, and the second signal in the second debugging process is automatically selected. When a selection of a first signal in the second debugging process is received, a second signal corresponding to the first signal is queried according to the signal correlation information, and the second signal in the first debugging process is automatically selected.

In some embodiments, an operation performed to the first signal in the first debugging process is received. In response to the operation, the same operation is performed to the second signal in the second debugging process. In some embodiments, the operation may be a drag of the first signal from a first window to a second window in the first debugging process. In some embodiments, the operation may be a drag of the first signal from a first window in the first debugging process to a second window in the second debugging process.

In some embodiments where multiple debugging processes are used, a communication link is established between the debugging processes, and synchronization information comprising the selection and/or the operation of the first signal is transmitted from the first debugging process to the second debugging process via the communication link.

In some embodiments, the first signal managed in the first debugging process and the second signal managed in the second debugging process is respectively annotated with a mark.

Methods for debugging designs may take the form of a program code embodied in a tangible media. When the program code is loaded into and executed by a machine, the machine becomes an apparatus for practicing the disclosed method.

BRIEF DESCRIPTION OF THE DRAWINGS

The invention will become more fully understood by referring to the following detailed description with reference to the accompanying drawings, wherein.

DETAILED DESCRIPTION OF THE INVENTION

Methods and systems for debugging designs described equivalently in at least two design levels are provided.

Figure 1:
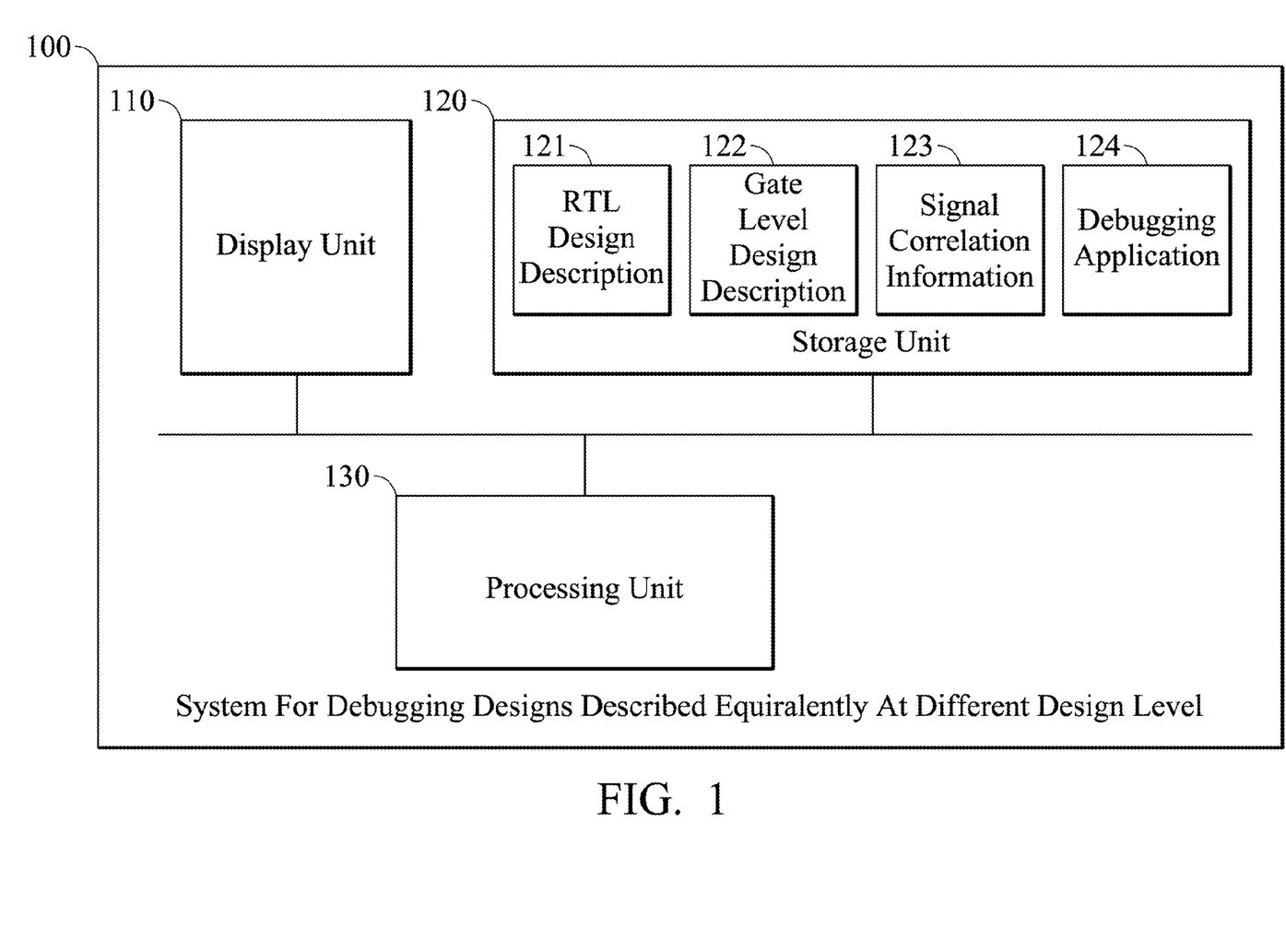
FIG. 1 is a schematic diagram illustrating an example embodiment of a system for debugging designs.

FIG. 1 is a schematic diagram illustrating an embodiment of a system for debugging designs according to the invention. The system for debugging designs 100 may be a processor-based electronic device, such as a computer system, a workstation, a notebook, or others.

The system for debugging designs 100 comprises a display unit 110, a storage unit 120, and a processing unit 130. The display unit 110 can display related texts, figures, user interfaces, and other data provided by an operating system and/or applications executed on the system. The storage unit 120 can comprise design descriptions corresponding to a same design at various design levels. For example, the storage unit 120 may comprise an RTL design description 121 and a gate level design description 122. It is noted that the RTL design description 121 and the gate level design description 122 are descriptions of the same design but at different design levels. The storage unit 120 may also comprise signal correlation information 123. The signal correlation information 123 records the mapping correlation between signals at the RTL design description 121 and signals at the gate level design description 122. It is understood that there are various methods for generating the signal correlation information. For example, in some embodiments, the signal correlation information 123 may be a text file manually prepared by the user. In some embodiments, the signal correlation information 123 may be a mapping file generated automatically by a machine. Further, in some embodiments, an RTL-to-Gate mapping method (U.S. Pat. No. 7,478,346) can be used to establish the signal-to-signal correlation between an RTL design and a gate level design. The storage unit 120 may further comprise at least one debugging application 124. In some embodiments, the debugging application 124 may run concurrently in multiple debugging processes. In some embodiments, each debugging application 124 runs in a debugging process, and several debugging applications 124 run concurrently in several debugging processes. It is understood that, in some embodiments, at least two separate processes can be executed, and each process can load a design description at a separate design level and manages a set of the windows for user to debug at that design level. Yet another embodiment of current method may execute only one process with at least two threads wherein each thread loads a design description at a separate design level and manages a set of the windows for user to debug at that design level. Still another embodiment of current method may execute only one process that loads the at least two design descriptions and maintains the at least two sets of the windows for debugging the at least two design descriptions respectively without using multiple threads to mange the at least two design descriptions. It is considered a matter of implementation preference regarding the number of processes and the number of threads in an embodiment of current method, and is immaterial with regard to the spirit of current invention. Obviously, when the multi-process approach is used, a communication link is needed which provides the message sending and receiving between the at least two processes. In order not to clutter the description of the current invention, multi-process approach is used for the remaining part of this disclosure except for those places where such simplification may result in ambiguity. In which case, an explicit description of which implementation approach is taken is provided. The processing unit 130 can perform the methods for debugging designs, which will be discussed further in the following paragraphs.

Figure 2:
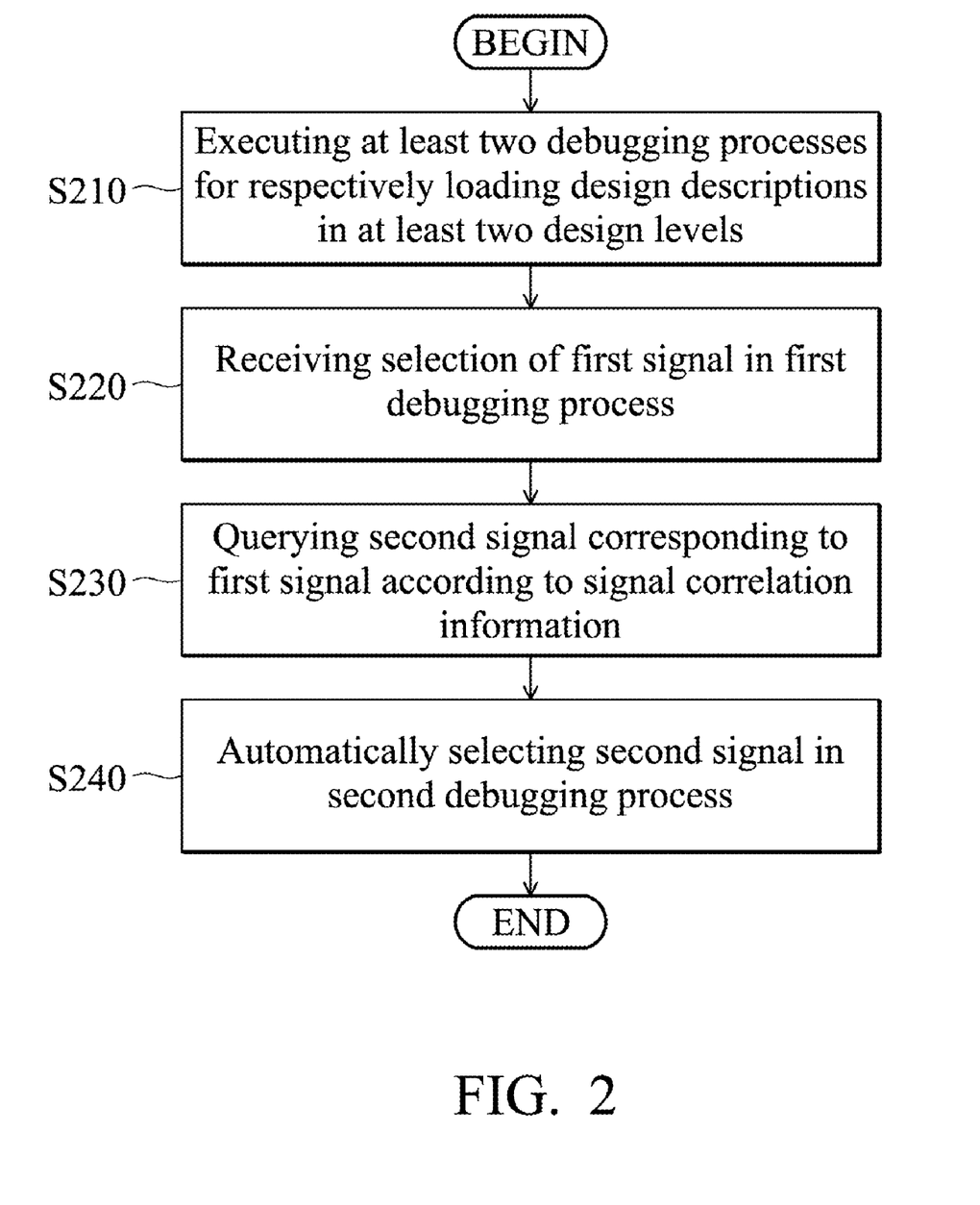
FIG. 2 is a flowchart of an example embodiment of a method for debugging designs.

FIG. 2 is a flowchart of an embodiment of a method for debugging designs according to the invention.

In step S210, at least two debugging processes are executed to respectively load design descriptions corresponding to a design at least two design levels, such as an RTL level and a gate level. It is noted that, in some embodiments, the debugging processes may run the same debugging application. In some embodiments, the respective debugging processes may respectively run different debugging applications. It is also understood that, in some embodiments, design descriptions corresponding to the design at the at least two design levels can be loaded and presented to the user in at least two sets of windows. Each set of windows is corresponded to each of the debugging processes. In step S220, a selection or designation of a first signal in a first debugging process among the debugging processes is received. In response to the selection, in step S230, a second signal corresponding to the first signal is queried according to the signal correlation information. Similarly, the methods for generating the signal correlation information may be various. In some embodiments, the signal correlation information may be a text file manually prepared by the user. In some embodiments, the signal correlation information may be a mapping file generated from a machine. Further, in some embodiments, an RTL-to-Gate mapping method (U.S. Pat. No. 7,478,346) can be used to establish the signal-to-signal correlation between an RTL design and a gate level design. After the second signal is known, in step S240, the second signal in a second debugging process among the debugging processes is automatically selected.

It is understood that, in some embodiments, the query of the second signal corresponding to the first signal can be performed by the first debugging process or the second debugging process. It is understood that, in some embodiments, the first signal in the first debugging process and the second signal in the second debugging process can be respectively annotated with a mark. In some embodiments, when the correlation between the first signal and the second signal can be directly found in the signal correlation information, the mark may be a first marking, such as a capital 'M'. For example, if there is a mapping A'=G2R_MAP(A) and A=R2G_MAP(A'), where A is a gate level signal and A' is its corresponding RTL level signal, the system will display $A^{(M)}$ and $A'^{(M)}$ in the set of windows for gate level design and the set of windows for RTL design, respectively. In some embodiments, when the correlation between the first signal and the second signal is derived from the signal correlation information and/or traced via equivalent signals and connectivity, the mark may be a second marking, such as a lower case 'm'. It is understood that, more complex annotations are possible if more complex statuses need to be displayed.

Figure 3:
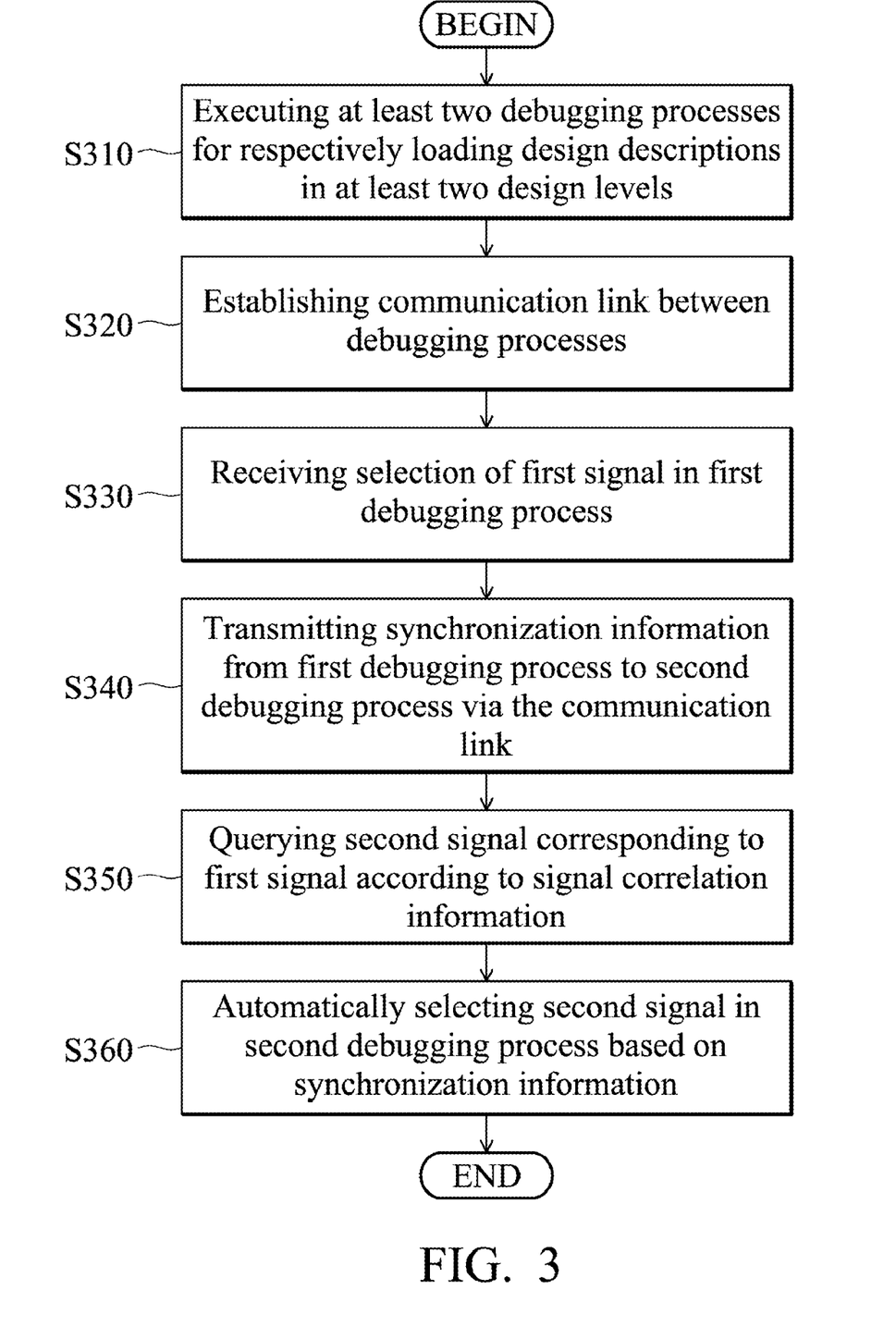
FIG. 3 is a flowchart of another example embodiment of a method for debugging designs.

FIG. 3 is a flowchart of another embodiment of a method for debugging designs according to the invention. In this embodiment, a communication link is established between the various debugging processes, and synchronization information is transmitted between the debugging processes via the communication link.

In step S310, at least two debugging processes are executed to respectively load design descriptions corresponding to a design at least two design levels, such as an RTL level and a gate level. Similarly, in some embodiments, the debugging processes may run the same debugging application. In some embodiments, the respective debugging processes may run different debugging applications. Similarly, in some embodiments, design descriptions corresponding to the design at the at least two design levels can be loaded and presented to the user in at least two sets of windows. Each set of windows is corresponded to each of the debugging processes. In step S320, a communication link is established between the debugging processes. It is understood that, in some embodiments, the communication link may be an Inter-Process Communication (IPC) socket. It is noted that the IPC is only an example of the embodiment, and the present invention is not limited thereto. In step S330, a selection or designation of a first signal in a first debugging process among the debugging processes is received. In response to the selection, in step S340, synchronization information comprising the selection of the first signal is transmitted from the first debugging process to a second debugging process among the debugging processes via the communication link. In step S350, a second signal corresponding to the first signal is queried according to the signal correlation information. Similarly, the methods for generating the signal correlation information may be various. In some embodiments, the signal correlation information may be a text file manually prepared by the user. In some embodiments, the signal correlation information may be a mapping file generated from a machine. Further, in some embodiments, an RTL-to-Gate mapping method (U.S. Pat. No. 7,478,346) can be used to establish the signal-to-signal correlation between an RTL design and a gate level design. After the second signal is known, in step S360, the second signal in the second debugging process among the debugging processes is automatically selected.

Similarly, in some embodiments, the query of the second signal corresponding to the first signal may be performed by the first debugging process or the second debugging process. Similarly, in some embodiments, the first signal in the first debugging process and the second signal in the second debugging process can be respectively annotated with a mark. In some embodiments, when the correlation between the first signal and the second signal can be directly found in the signal correlation information, the mark may be a first marking, and when the correlation between the first signal and the second signal is derived from the signal correlation information and/or traced via equivalent signals and connectivity, the mark may be a second marking.

It is understood that, the user has the option to connect or disconnect the two debugging processes to enable or disable synchronized debugging operations. Once the two debugging processes are connected, all the debugging operations are synchronized on the two designs. Further, at any time during the debugging session, the user can disconnect the two debugging processes to stop the synchronization. After that, the two debugging processes go back to the regular mode and work as two independent tools.

Figure 4:
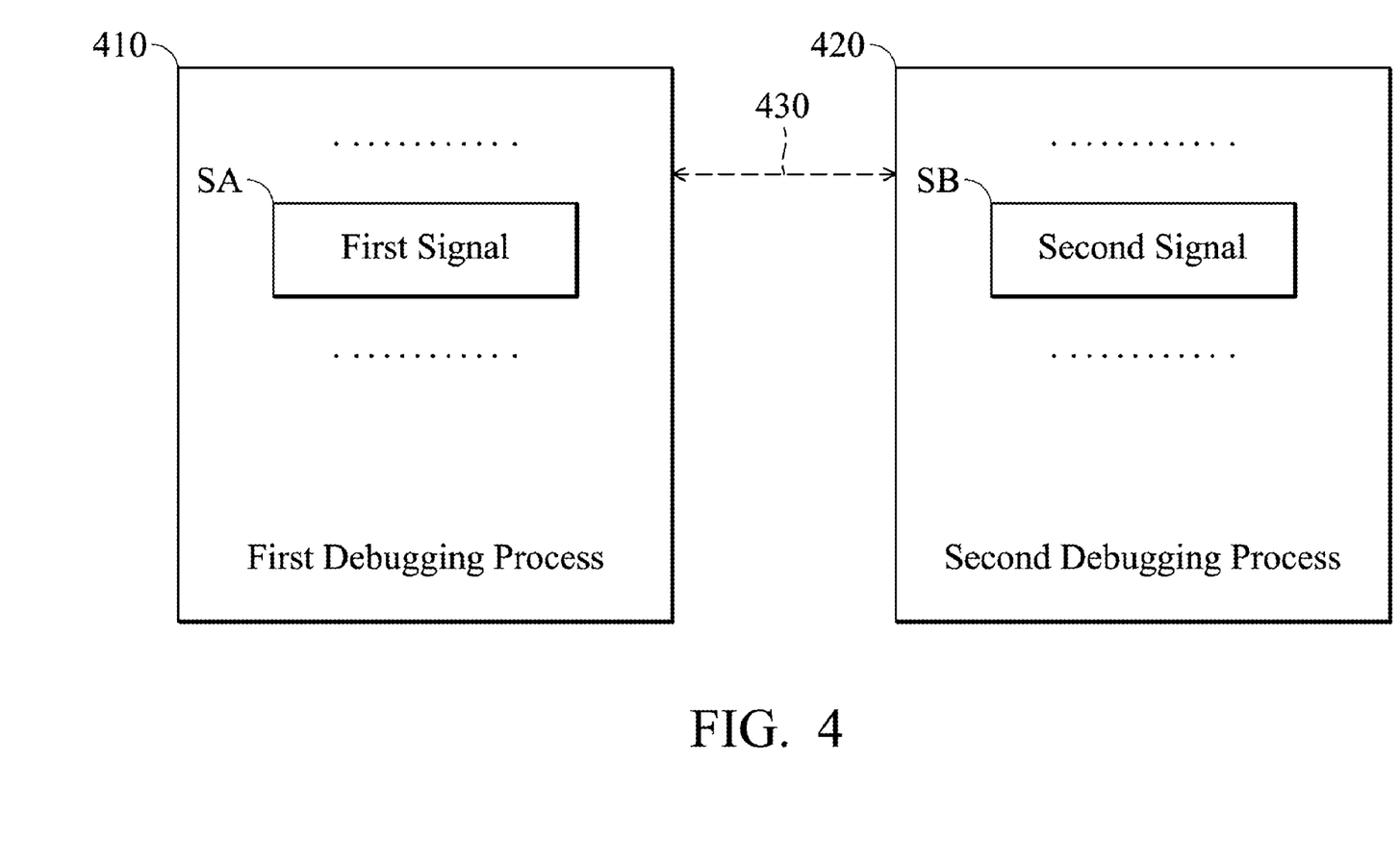
FIG. 4 is a schematic diagram illustrating an example of debugging designs in two separate processes.

FIG. 4 is a schematic diagram illustrating an example of debugging designs in two processes. As shown in FIG. 4, a first debugging process 410 and a second debugging process 420 are connected via an IPC 430. When a first signal SA is selected in a first debugging process 410, a second signal SB can be queried according to the first signal SA and the signal correlation information (not shown in FIG. 4), and the second signal SB is automatically selected in the second debugging process 420.

Figure 5:
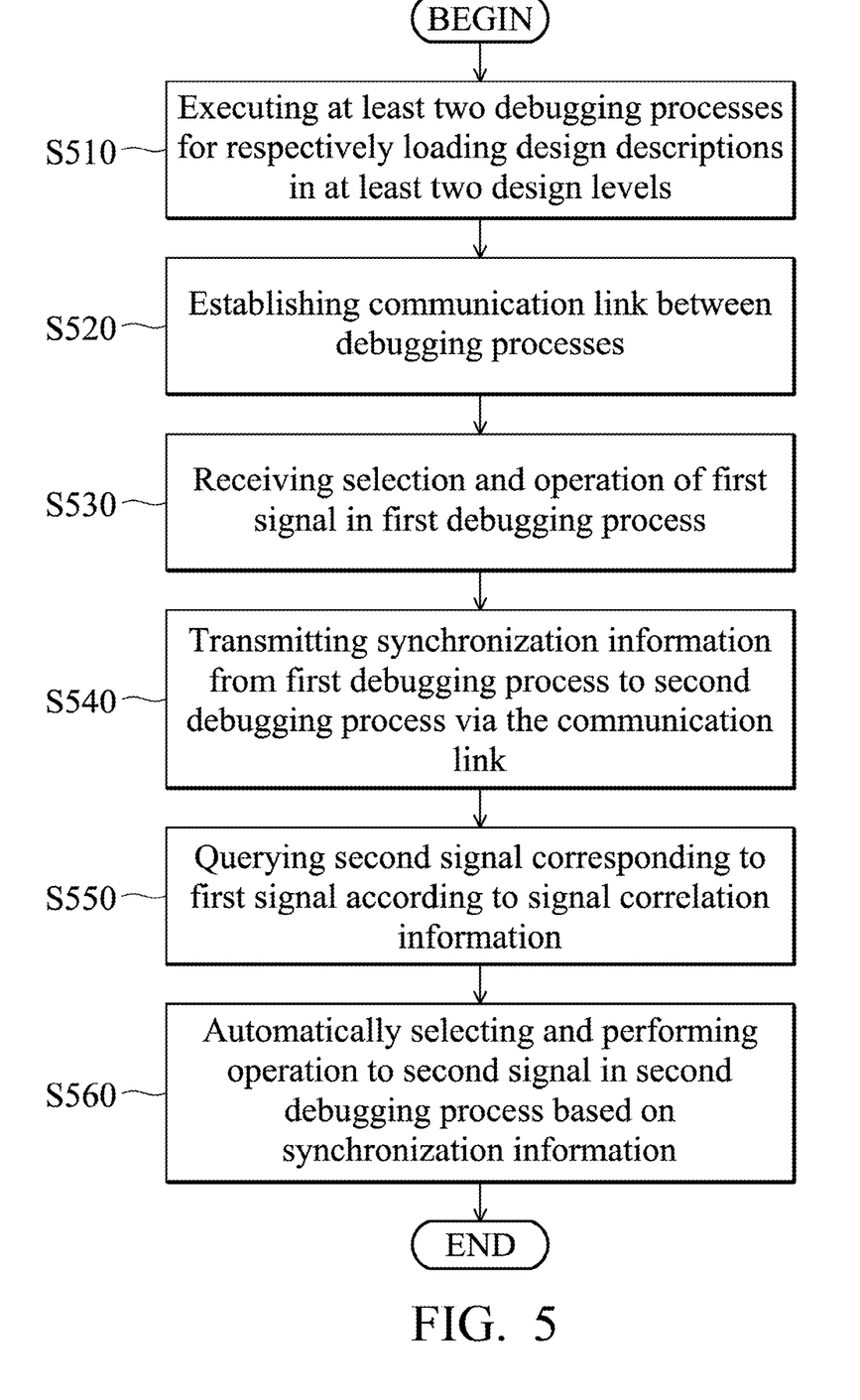
FIG. 5 is a flowchart of another embodiment of a method for debugging designs.

FIG. 5 is a flowchart of another embodiment of a method for debugging designs according to the invention. In this embodiment, a communication link is established between the various debugging processes, and synchronization information is transmitted between the debugging processes via the communication link. Further, in this embodiment, an operation, such as "trace connectivity", is also performed to the selected signal.

In step S510, at least two debugging processes are executed to respectively load design descriptions corresponding to a design at least two design levels, such as an RTL level and a gate level. Similarly, in some embodiments, the debugging processes may run the same debugging application. In some embodiments, the respective debugging processes may run different debugging applications. Similarly, in some embodiments, design descriptions corresponding to the design at the at least two design levels can be loaded and presented to the user in at least two sets of windows. Each set of windows is corresponded to each of the debugging processes. In step S520, a communication link is established between the debugging processes. Similarly, in some embodiments, the communication link may be an Inter-Process Communication (IPC) socket. It is noted that the IPC is only an example of the embodiment, and the present invention is not limited thereto. In step S530, a selection and an operation such as "trace connectivity" performed to a first signal in a first debugging process among the debugging processes are received. In response to the selection and operation, in step S540, synchronization information comprising the selection and operation performed to the first signal is transmitted from the first debugging process to a second debugging process among the debugging processes via the communication link. In step S550, a second signal corresponding to the first signal is queried according to the signal correlation information. Similarly, the methods for generating the signal correlation information may be various. In some embodiments, the signal correlation information may be a text file manually prepared by the user. In some embodiments, the signal correlation information may be a mapping file generated from a machine. Further, in some embodiments, an RTL-to-Gate mapping method (U.S. Pat. No. 7,478,346) can be used to establish the signal-to-signal correlation between an RTL design and a gate level design. After the second signal is known, in step S560, the second signal in the second debugging process among the debugging processes is automatically selected, and the same operation which has been applied to the first signal in the first debugging process is automatically applied to the second signal in the second debugging process.

Similarly, in some embodiments, the query of the second signal corresponding to the first signal can be performed by the first debugging process or the second debugging process. Similarly, in some embodiments, the first signal in the first debugging process and the second signal in the second debugging process can be respectively annotated with a mark. In some embodiments, when the correlation between the first signal and the second signal can be directly found in the signal correlation information, the mark may be a first marking, and when the correlation between the first signal and the second signal is derived from the signal correlation information and/or traced via equivalent signals and connectivity, the mark may be a second marking.

Figure 6:
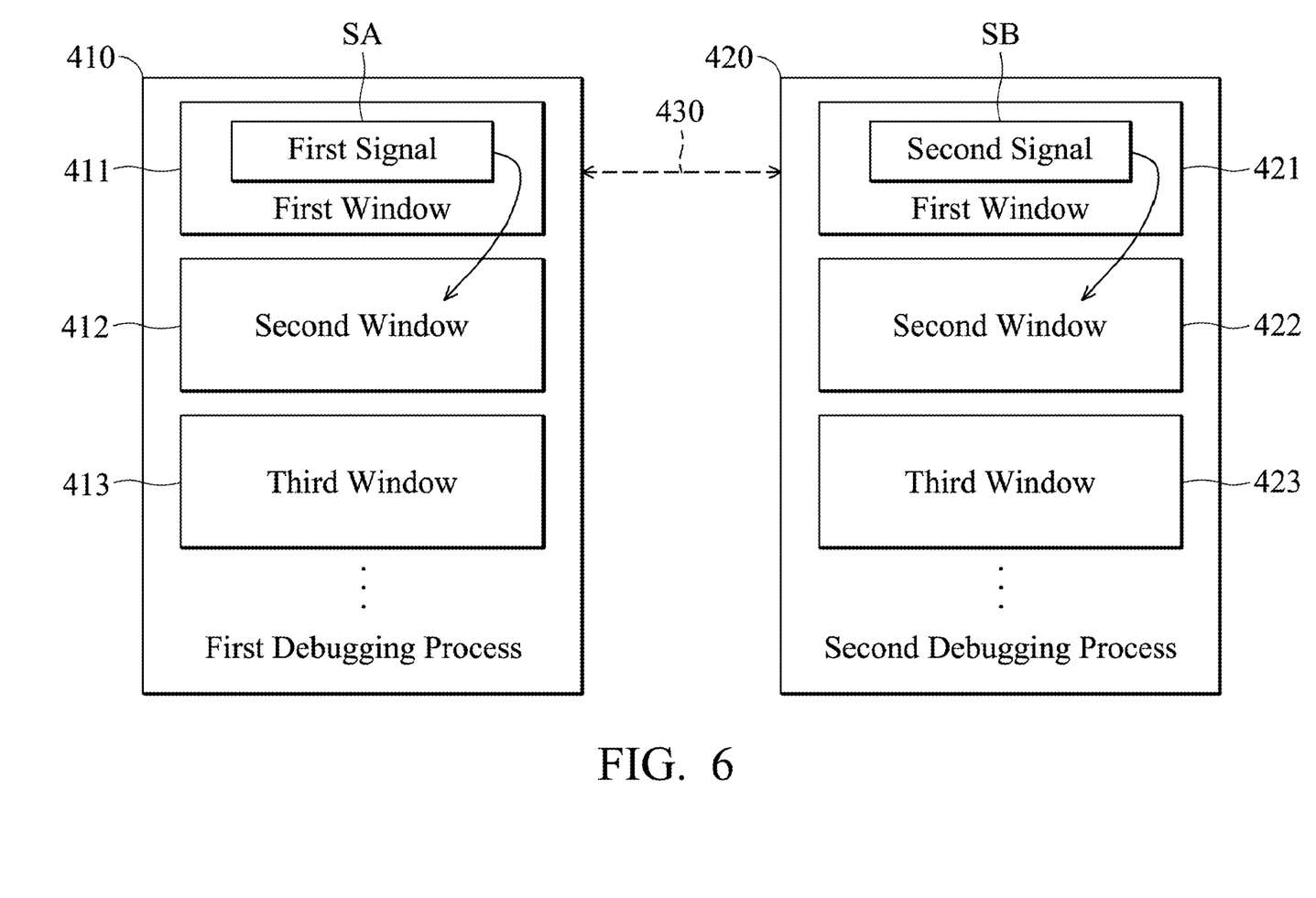
FIG. 6 is a schematic diagram illustrating another example of debugging designs in two separate processes.
Figure 7:
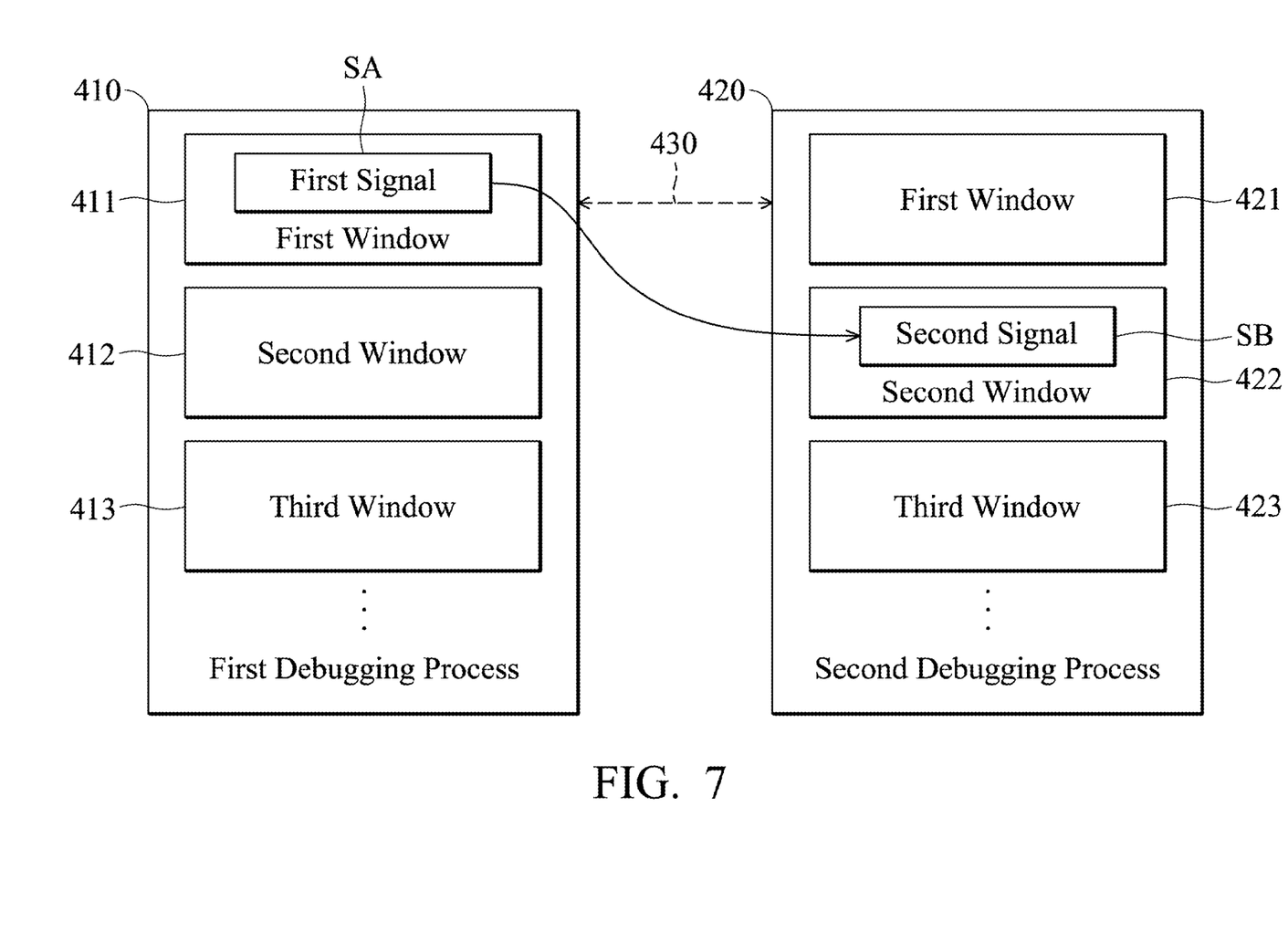
FIG. 7 is a schematic diagram illustrating yet another example of debugging designs in two separate processes.

It is understood that, in some embodiments, each of the debugging processes may have a plurality of windows, each corresponding to a debugging function or tool. For example, a debugging process may provide different windows for respectively browsing source code, viewing waveforms, and viewing schematics of a design. In some embodiments, the operation may be a drag of a signal from a first window to a second window in the same debugging process. For example, in FIG. 6, the first signal SA is dragged from a first window 411 to a second window 412 in the first debugging process 410. In response to the operation, the synchronization information comprising the selection and the operation performed to the first signal SA can be transmitted from the first debugging process 410 to the second debugging process 420 via the IPC 430. In response to the synchronization information, the second debugging process 420 can query the second signal SB according to the first signal SA and the signal correlation information (not shown in FIG. 6), automatically select the second signal SB in the second debugging process 420, and automatically drag the second signal SB from the first window 421 to the second window 422 in the second debugging process 420. In some embodiments, the operation may be a drag of a signal from a window to another window in different debugging processes. For example, in FIG. 7, the first signal SA is dragged from the first window 411 in the first debugging process 410 to the second window 422 in the second debugging process 420. In response to the operation, the synchronization information is transmitted from the first debugging process 410 to the second debugging process 420 via the IPC 430. In response to the synchronization information, the second debugging process 420 can query the second signal SB according to the first signal SA and the signal correlation information (not shown in FIG. 7), automatically locate the second signal SB in the second window 422 in the second debugging process 420, and automatically perform the predefined "drop site" operation to the second signal SB in the second window 422.

Therefore, the methods and systems for debugging designs can synchronously debug designs described equivalently at different design levels, such as an RTL level and a gate level, such that designers can browse and trace the several design levels at the same time, thus significantly reducing the debugging time for complex designs. Further, with the annotation function, in different parts of the debugging process, such as the source code browser, waveform viewer, or schematic viewer, the correlation/mapping status is displayed for each signal that is visible to the user, such that the user does not have to switch between two debugging processes and to use other operations to see the logic links, such as signal-to-signal correspondences between two design levels.

Methods for debugging designs described equivalently at different design levels, or certain aspects or portions thereof, may take the form of a program code (i.e., executable instructions) embodied in tangible media, such as floppy diskettes, CD-ROMS, hard drives, or any other machine-readable storage medium, wherein, when the program code is loaded into and executed by a machine, such as a computer, the machine thereby becomes an apparatus for practicing the methods. The methods may also be embodied in the form of a program code transmitted over some transmission medium, such as electrical wiring or cabling, through fiber optics, or via any other form of transmission including wireless communication, wherein, when the program code is received and loaded into and executed by a machine, such as a computer, the machine becomes an apparatus for practicing the disclosed methods. When implemented on a general-purpose processor, the program code combines with the processor to provide a unique apparatus that operates analogously to application specific logic circuits.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed:

1. A computer-implemented method for debugging designs, comprising:
    obtaining signal correlation information for signals of a design at least two design levels, by using a computer;
    loading and presenting design descriptions corresponding to the design at the at least two design levels in at least two sets of windows, by using the computer;
    receiving a selection of a first signal in a first set of windows, by using the computer;
    in response to the selection of the first signal, querying a second signal corresponding to the first signal according to the signal correlation information, so as to select the second signal in a second set of windows, by using the computer;
    executing at least two debugging processes, by using the computer, each responsible for loading one of the design descriptions at the at least two design levels, and each in control of one of the at least two sets of windows for debugging the loaded design, wherein each debugging process has a plurality of windows;
    receiving a drag of the first signal from a first window in a first debugging process to a second window in a second debugging process, by using the computer; and
    in response to a synchronization information comprising the drag of the first signal, locating the second signal in the second window in the second debugging process, by using the computer.

2. The method of claim 1, further comprising:
    establishing a communication link between the at least two debugging processes; and
    transmitting the synchronization information comprising the selection of the first signal from the first debugging process to the second debugging process via the communication link; and
    in response to the synchronization information, selecting the second signal in the second debugging process by the second debugging process.

3. The method of claim 2, further comprising:
    receiving an operation performed to the first signal in the first debugging process; and
    in response to the operation, performing the operation to the second signal in the second debugging process.

4. The method of claim 3, wherein each of the debugging processes has a plurality of windows, each corresponding to a debugging function or tool, and the operation comprises a drag of the first signal from a first window to a second window in the first debugging process, and in response to the synchronization information, the second debugging process drags the second signal from the first window to the second window in the second debugging process.

5. The method of claim 1, further comprising respectively annotating with a mark to the first signal in the first set of windows and the second signal in the second set of windows, wherein the two signals are correlated according to the signal correlating information.

6. The method of claim 5 wherein the mark is a first marking when the correlation between the first signal and the second signal is directly found in the signal correlation information, and the mark is a second marking when the correlation between the first signal and the second signal is derived according at least to the signal correlation information.

7. The method of claim 1, wherein each of the debugging processes has a plurality of windows, each corresponding to a debugging function or tool, and the method further comprises the steps of:

establishing a communication link between the debugging processes;

transmitting synchronization information comprising the drag of the first signal from the first debugging process to the second debugging process via the communication link.

8. The method of claim 1, wherein the design levels comprise a register transfer level (RTL) and a gate level.

9. The method of claim 1, wherein the step of querying the second signal corresponding to the first signal according to the signal correlation information is performed either by the first debugging process or by the second debugging process.

10. A machine-readable storage medium comprising a computer program, which, when executed, causes a device to perform a method for debugging designs, wherein the method comprises:

obtaining signal correlation information for signals of a design at least two design levels;

loading and presenting design descriptions corresponding to the design at the at least two design levels in at least two sets of windows;

receiving a selection of a first signal in a first set of windows;

in response to the selection of the first signal, querying a second signal corresponding to the first signal according to the signal correlation information, so as to select the second signal in a second set of windows;

executing at least two debugging processes, each responsible for loading one of the design descriptions at the at least two design levels, and each in control of one of the at least two sets of windows for debugging the loaded design, wherein each debugging processe has a plurality of windows;

receiving a drag of the first signal from a first window in a first debugging process to a second window in a second debugging process; and in response to a synchronization information comprising the drag of the first signal, locating the second signal in the second window in the second debugging process.

11. A computer-implemented method for debugging designs, comprising the steps of:

executing, by using a computer, two debugging processes, each responsible for loading one of two design descriptions at two design levels and signal correlation information, and each in control of one of two sets of windows for debugging a design;

establishing a communication link between the two debugging processes;

receiving, by a first debugging process, a drag of a first signal from a first window to a second window controlled by the first debugging process;

transmitting, by the first debugging process, synchronization information comprising the drag of the first signal from the first window to the second window, to the second debugging process via the communication link; and in response to the synchronization information, querying the signal correlation information and performing a drag of the signal corresponding to the first signal from the window corresponding to the first window to the window corresponding to the second window, by the second debugging process.

12. The method of claim 11, wherein the design levels comprise a register transfer level (RTL) and a gate level.

13. A computer-implemented method for debugging designs, comprising the steps of:

executing two debugging processes, each responsible for loading one of two design descriptions at two design levels and signal correlation information, and each in control of one of two sets of windows for debugging the loaded design;

establishing a communication link between the two debugging processes;

receiving, by the computer, a drag of a first signal from a first window controlled by a first debugging process to a second window controlled by a second debugging process;

transmitting, by the first debugging process, synchronization information comprising the drag of the first signal to the second debugging process via the communication link; and in response to the synchronization information, querying the signal correlation information to locate the corresponding signal in the second window, by the second debugging process.

\* \* \* \* \*